(12) United States Patent
Schneegans et al.

(10) Patent No.: US 8,156,643 B2
(45) Date of Patent: Apr. 17, 2012

(54) SEMICONDUCTOR DEVICE

(75) Inventors: Manfred Schneegans, Vaterstetten (DE); Markus Leicht, Villach (AT); Stefan Woehlert, Villach (AT); Edmund Riedl, Gebelkofen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/008,928

(22) Filed: Jan. 19, 2011

(65) Prior Publication Data

US 2011/0107595 A1    May 12, 2011

Related U.S. Application Data

(62) Division of application No. 11/767,769, filed on Jun. 25, 2007, now Pat. No. 7,911,061.

(51) Int. Cl.
    *H01L 21/58* (2006.01)
(52) U.S. Cl. ....... 29/840; 174/263; 228/180.5; 257/762; 257/772; 257/781; 257/784; 257/786; 257/E21.509; 361/743; 438/612; 438/614; 438/615; 438/617; 438/687
(58) Field of Classification Search .................. 257/762, 257/772, 781, 784, 786, E21.509; 438/612, 438/614, 615, 617, 687; 361/743; 174/263; 228/180.5; 29/840
    See application file for complete search history.

(56) References Cited

U.S. PATENT DOCUMENTS

| | | | |
|---|---|---|---|
| 5,420,073 A | 5/1995 | DiGiacomo et al. | |
| 5,455,461 A | 10/1995 | Koide et al. | |
| 6,265,300 B1 | 7/2001 | Bhansali et al. | |
| 6,329,722 B1 | 12/2001 | Shih et al. | |
| 6,515,373 B2 | 2/2003 | Barth | |
| 6,800,555 B2 | 10/2004 | Test et al. | |
| 7,351,651 B2 | 4/2008 | Li et al. | |
| 7,709,938 B2 | 5/2010 | Laska | |
| 2003/0219976 A1 | 11/2003 | Gleason | |
| 2005/0046040 A1 | 3/2005 | Wang et al. | |

FOREIGN PATENT DOCUMENTS

| | | |
|---|---|---|
| DE | 4303790 | 8/1994 |
| DE | 102005028951 | 12/2006 |
| WO | 9616768 | 6/1996 |
| WO | 0057472 | 9/2000 |
| WO | 03075340 | 9/2003 |

OTHER PUBLICATIONS

English Machine Translation of DE 4303790, obtained Sep. 6, 2011.*
Silvana Andrea Sommadossi, Investigation on Diffusion Soldering in Cu/In/Cu and Cu/In-48SN/Cu Systems, Dissertation an der Universitat Stuttgart, Bericht Nr. 125, Jul. 2002.
Office Action mailed Mar. 30, 2010.

* cited by examiner

*Primary Examiner* — Eugene Lee
*Assistant Examiner* — Peniel M Gumedzoe
(74) *Attorney, Agent, or Firm* — Dicke, Billig & Czaja, PLLC

(57) ABSTRACT

A method of electrically interconnecting a semiconductor chip to another electronic device including providing a carrier including contact pins and a chip attached to the carrier, the chip having a copper contact pad that faces away from the carrier, extending a copper electrical connector between the contact pins and the contact pad, and diffusion soldering the copper electrical connector to the active area with a solder material including tin to form a solder connection including a contiguous bronze coating disposed between and in direct contact with both the copper electrical connector and the contact pad.

20 Claims, 10 Drawing Sheets

SEMICONDUCTOR DEVICE

CROSS-REFERENCE TO RELATED APPLICATIONS

This Utility patent application is a divisional application of U.S. application Ser. No. 11/767,769, filed Jun. 25, 2007, which is incorporated herein by reference.

BACKGROUND

Market demand for smaller, lighter, and more powerful electronic devices has driven the development of more compact packages having increased functionality. The market demand has spurred semiconductor packaging technologies in the areas of fine pitch ball grid arrays (FBGA), chip-scale packages (CSP), wafer-level packaging (WLP), multi-chip module (MCM) technology, and stacked die packaging. MCM technologies provide multiple semiconductor chips functionally assembled in one package, such as multiple stacked die in a CSP or multiple stacked die on a BGA.

A die package includes one or more semiconductor chips mounted to a carrier and electrical connectors attached between the carrier and the chip. The electrical connectors include wires, clips, etc., that electrically connect the chip to other electronic devices. Ball bonding is one way of bonding the electrical connectors to the chip. Ball bonding uses a combination of heat, pressure, and ultrasonic energy to weld the connectors onto the chip.

Copper electrical connectors are relatively inexpensive and have superior electrical properties compared to gold or aluminum connectors. However, the melting point of copper is about 1083 degrees Celsius, such that high temperatures and force are used during copper ball bonding. The high force applied during connection of the connector to the chip has the potential to damage the chip. For this reason, ball bonding a copper connector to an active surface of a chip is undesirable. In addition, copper is highly susceptible to oxidation. The use of copper electrical connectors necessitates that some method of preventing oxidation of the copper be employed during bonding. One approach includes purging the atmosphere near the bond site with an inert gas (e.g., nitrogen) to minimize the oxidation of the copper during bonding. Inert gas purging during the electrical connection process is an expensive and an undesirable extra step.

For these and other reasons there is a need for the present invention.

SUMMARY

One aspect provides a semiconductor device including a carrier, a chip including a first face having a contact area, where the chip is attached to the carrier such that the contact area faces away from the carrier, a copper connector configured for attachment to the contact area, and a solder material configured to couple the copper connector to the contact area.

BRIEF DESCRIPTION OF THE DRAWINGS

The accompanying drawings are included to provide a further understanding of the disclosure and are incorporated in as a part of this specification. The drawings illustrate embodiments and together with the description serve to explain the principles of the invention. Other embodiments and many of the intended advantages will be appreciated as they become better understood by reference to the following Detailed Description. The elements of the drawings are not necessarily to scale relative to each other. Like reference numerals designate corresponding similar parts.

DETAILED DESCRIPTION

Figure 1:
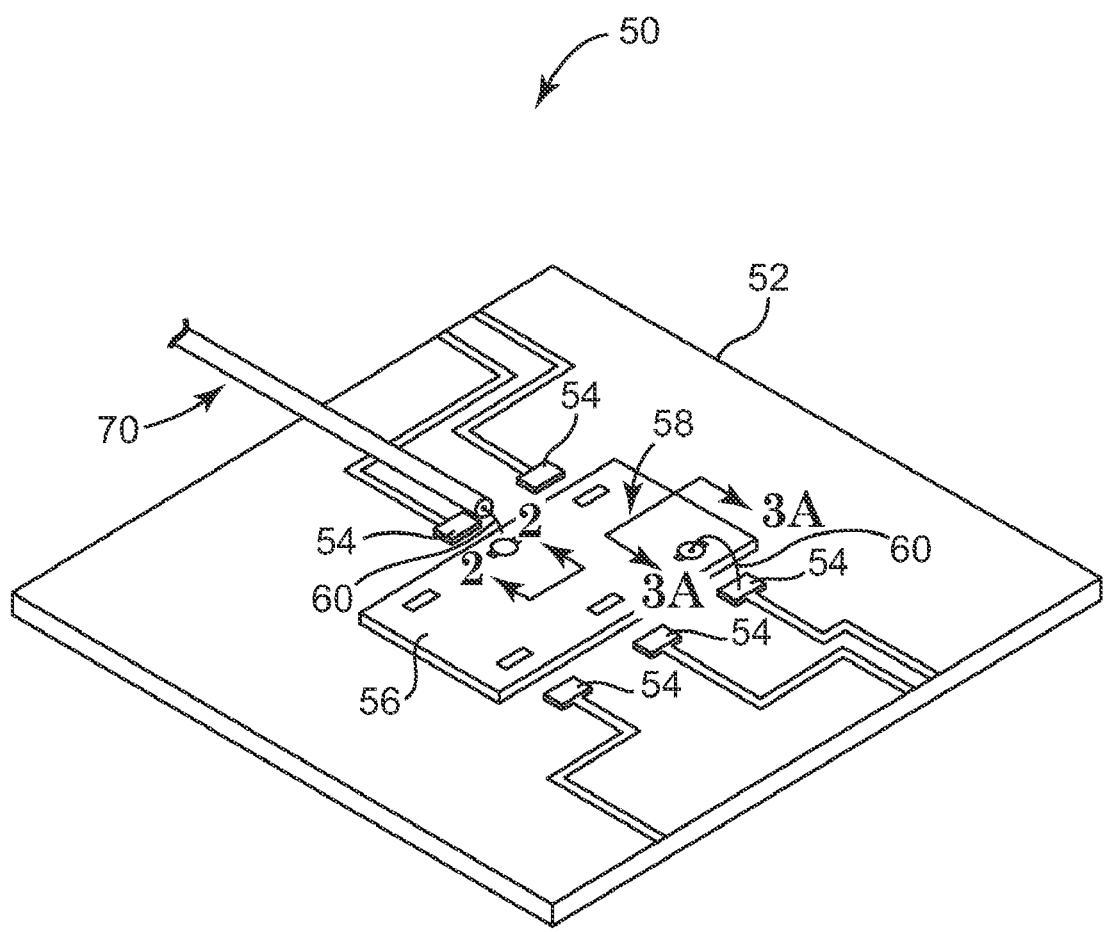
FIG. 1 is a perspective view of a die package semiconductor device illustrating attachment of a connector between a carrier and a chip attached to the carrier according to one embodiment.

In the following Detailed Description, reference is made to the accompanying drawings, which form a part hereof, and in which is shown by way of illustration specific embodiments. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Ball bonding is a common way to make electrical interconnections between a microchip and a carrier to which the chip is attached, and connections to other devices electrically communicating with the microchip. During ball bonding, a wire or other connector is extended (or fed from) a ballbond machine and electrically connected to a contact pad on the chip through a combination of heat, pressure, and/or ultrasonic energy to ensure that the connector is durably connected to the microchip. The heat/pressure associated with ball bonding connectors to the contact area of the chip has the potential to damage the active area of the chip.

A copper connector is preferred over gold or aluminum connectors because copper is less expensive than gold, harder than gold, and has superior electrical properties. However, copper connectors are highly susceptible to oxidation, which reduces the electrical properties of the copper. The use of copper connectors in a bonding process thus necessitates some additional step to minimize oxidation of the copper material. In addition, ball bonding hard copper connectors to the contact area of the chip necessitates the use of higher bonding temperatures and pressures, both of which have the potential to damage the active area of the chip.

Embodiments described below provide a copper connector attached between a carrier and an active area of a microchip with tin solder. In some embodiments, the tin solder is provided on the microchip and is configured to alloy with the copper connector to form a bronze surface that has excellent electrical properties and is resistant to surface oxidation. Other embodiments provide tin solder that is applied to the copper connector, such that when the copper connector is connected to the active area on the chip, a bronze material is formed on the copper connector and the active area of the microchip. Other embodiments provide tin disposed on the microchip and a separate tin material applied over a copper connector, such that when the copper connector is connected to the contact area on the microchip, a bronze material is formed between the copper connector and the contact area of the microchip.

Embodiments described below provide for electrical connection to the active area of the chip at relatively low temperatures (i.e., at less than about 300 degrees Celsius), relatively low bond pressures, and without ultrasonic energy. The tin enables electrical connection between the copper connector and the active surface at lower temperatures and at lower bond pressures than is common in wire ball bonding, which minimizes chip damage and contributes to the potential for higher wafer yield. Although certain of the connectors described below include copper connectors (such as copper wires, bondwires, clips and the like), embodiments described herein are applicable to non-copper connectors, including gold and aluminum connectors.

FIG. 1 is a perspective view of a semiconductor die package 50 according to one embodiment. Die package 50 includes a carrier 52 having contact pins 54, a chip 56 having an active area 58 with the chip 56 attached to carrier 52 such that active area 58 faces away from carrier 52, and connectors 60 coupled between contact pins 54 of carrier 52 and active area 58 of chip 56. A capillary tool 70 (or assembly tool 70) is employed to feed connector 60 to active area 58 and couple connector 60 to active area 58 and contact pins 54. Capillary tool 70 is configured to feed a suitable length of connector 60 for attachment between contact pins 54 of carrier 52 and active area 58 of chip 56.

Die package 50 is a semiconductor device that includes chip-scale packages, wafer-level packages, multi-chip modules, and fine pitch ball grid arrays. Carrier 52 includes leadframes, ceramic carriers, printed circuit boards, and other suitable packaging substrates. Chip 56 is an integrated circuit and includes semiconductor chips in general, such as memory chips and controller chips and the like. Connectors 60 include bondwires, ribbons, clips, and wires in general. One embodiment provides connectors 60 formed of copper to have electrical properties superior to gold and aluminum connectors, for example. Capillary tool 70 includes ball bond discharge tools configured for ball bond welding, cold welding, wedge bonding, tail bonding, and stud bumping. Other suitable tools for forming a connection between carrier 52 and chip 56 are also acceptable.

Figure 2:
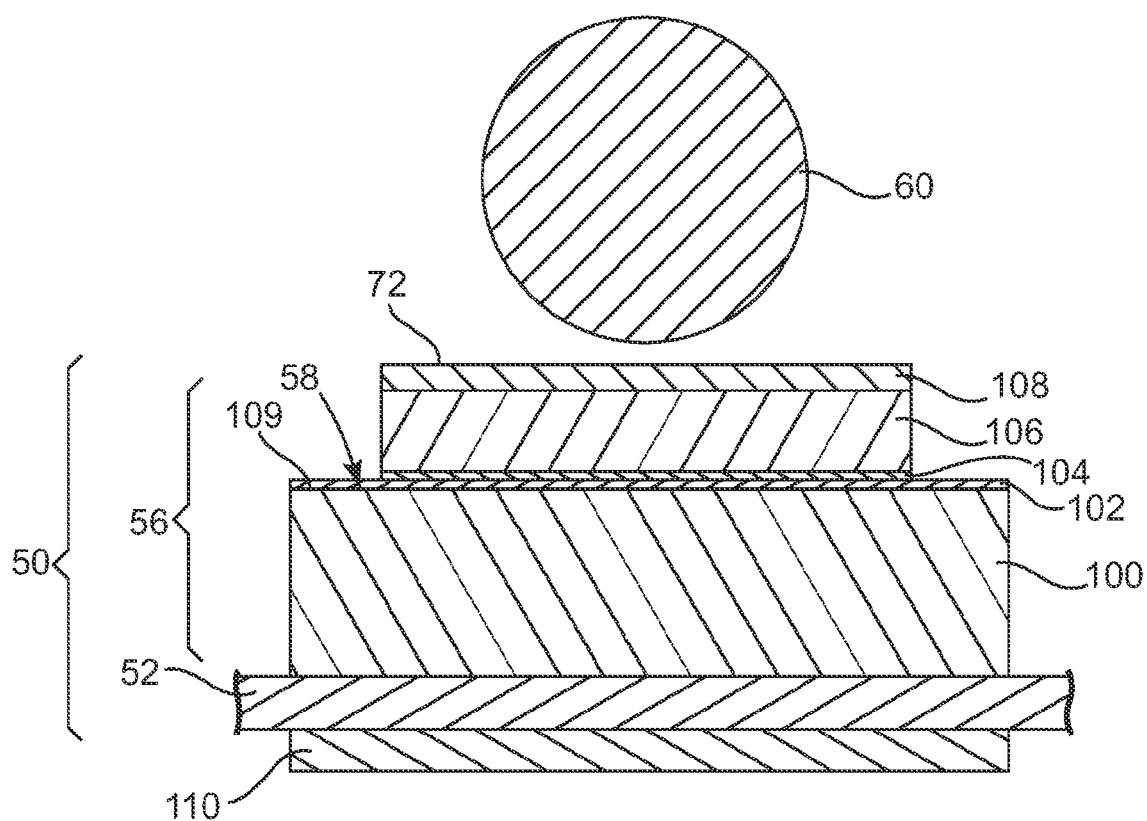
FIG. 2 is a cross-sectional view of the semiconductor device shown in FIG. 1 illustrating a connector prior to attachment to a contact area on a chip.

FIG. 2 is a cross-sectional view of the semiconductor device/die package 50 shown in FIG. 1 illustrating connector 60 just prior to attachment to contact area 72 on chip 56. In one embodiment, chip 56 includes a substrate 100, a passivation layer 102 disposed on substrate 100, a metal layer 104 disposed on passivation layer 102, a superstrate of power copper 106 disposed on metal layer 104, and a material 108 disposed on power copper superstrate 106. In one embodiment, material 108 includes material 108, indium material 108, or gallium material 108.

In one embodiment, chip 56 is fabricated in a wafer fabrication process in which a wafer of silicon is fabricated to include a first face 109 having multiple integrated circuits disposed on active area 58. Contact area 72 is formed over active area 58 and defines a contact pad for back end electrical connection of chip 56 with other electronic devices. Suitable materials for connector 60 and active area 58 on the microchip include copper, silver, or gold. The fabricated wafer is configured to be singulated into multiple chips 56. In one embodiment, substrate 100 is a silicon substrate and passivation layer 102 is a silicon nitride that is suitably etched to provide electrical communication with power copper superstrate 106. Other suitable materials for passivation layer 102 are also acceptable, such as glass, glass oxides and other nitrides. In one embodiment, metal layer 104 includes titanium-tungsten (TiW). Other suitable materials for metal layer 104 are also acceptable, such as alloys of titanium, alloys of tungsten, and other metal alloys.

In one embodiment, power copper superstrate 106 is a patterned resist structure that is pattern-plated onto substrate 100. In this specification, superstrate means a layer that is disposed above a substrate. In one embodiment, power copper superstrate is patterned, for example photo-lithographically patterned, to have a thickness of between about 10-30 micrometers. In one embodiment, material 108 includes tin having a thickness of between about 1-10 micrometers and is pattern resist plated along with patterned power copper superstrate 106. In one embodiment, power copper superstrate 106 and material 108 are in situ deposited onto a wafer in a single process, and after metal deposition the resist layer and TiW metal layer 104 are selectively removed to open pathways between power copper superstrate 106 and material 108 and active surface 58 of chip 56. Other suitable manners of fabricating a silicon wafer to include semiconductor chips having an active surface are also acceptable.

In one embodiment, connector 60 is a copper connector having a melting temperature of about 1083 degrees Celsius, and material 108 is tin (i.e., Sn) having a melting temperature of about 232 degrees Celsius. In one embodiment, a heater 110 is applied in contact with substrate 100 (i.e., a backside of chip 56) to heat the chip 56 to approximately the melting temperature of tin. For example, in one embodiment heater 110 heats chip 56 to a bonding temperature of about 260 degrees Celsius to enable material 108 to form a bond between connector 60 and active surface 58 of chip 56. In this regard, connector 60 is solder bonded to power copper superstrate 106 at a bonding temperature of about 260 degrees Celsius, which is hundreds of degrees Celsius cooler than bonding temperatures commonly employed when wire ball bonding copper connectors. In contrast with the known ball bonding processes, embodiments provided herein provide for low temperature bonding of copper connectors to copper pads on a chip in the absence of ultrasonic energy, at low bonding forces, and in a manner that resists oxidation of the copper connector.

Figure 3A:
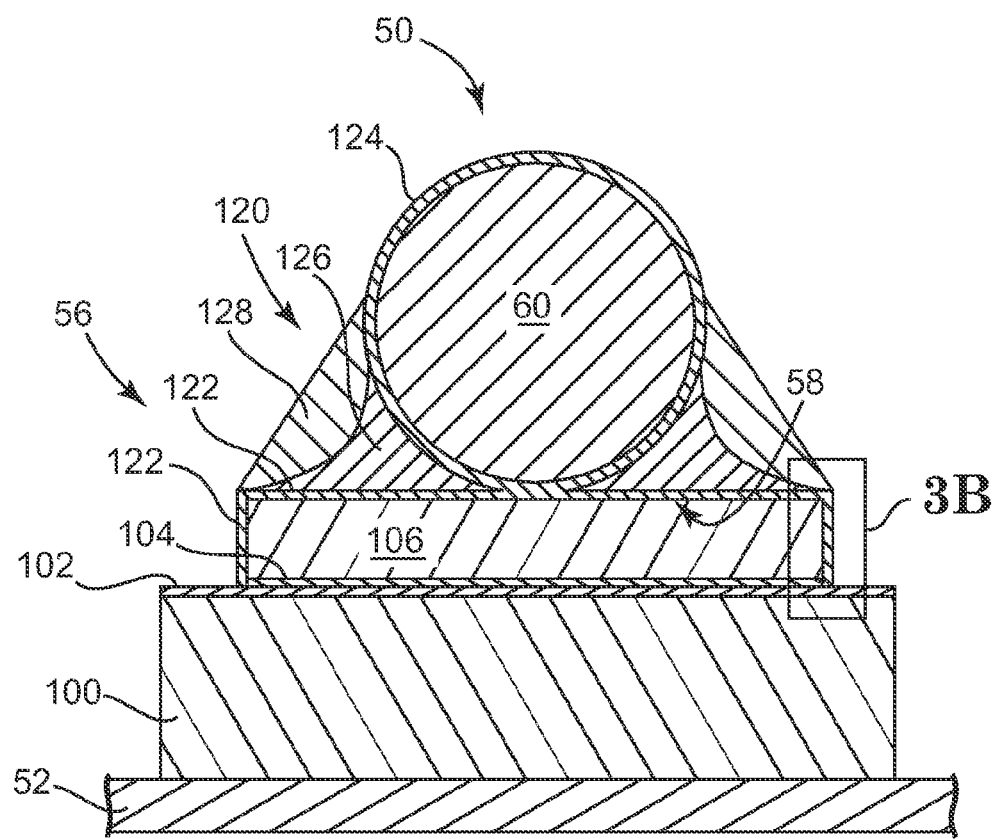
FIG. 3A is a cross-sectional view of the connector attached to the contact area of the chip shown in FIG. 2.

FIG. 3A is a cross-sectional view of connector 60 electrically coupled to power copper superstrate 106. In one embodiment, material 108 (FIG. 2) is heated to a flowable state and wets connector 60 and power copper superstrate 106. Tin has a strong affinity for copper, and when material 108 is heated to flowable state, material 108 flows over and conformally wets the connector 60 and power copper superstrate 106. In one embodiment, material 108 reacts with the copper of connector 60 and superstrate 106 to form an alloy of solder material 120 coupled between connector 60 and power copper superstrate 106.

In one embodiment, solder material 120 includes a bronze conformal coating 122 over power copper superstrate 106, a sheath 124 over connector 60, a first bronze bead 126 extending between coating 122 and sheath 124, and a second bead 128 contacting first bead 126. In this Specification, bronze means an alloy of copper and tin, including compounds of copper and tin, and any of the alloys of copper and tin. The strong affinity that tin has for copper, in combination with the surface tension of the melted tin, combine to deposit solder 120 between connector 60 and power copper superstrate 106.

When material 108 (FIG. 2) is heated and contacts copper, the tin and copper electrolytically combine to form one or more bronze beads/layers between connector 60 and superstrate 106. In one embodiment, conformal coating 122 and sheath 124 each include a bronze of Cu3Sn, first bead 126 includes a bronze of Cu6Sn5, and second bead 128 is pure tin (Sn). Other suitable metallurgical forms of solder material 120 are also acceptable, including tin, indium, and gallium, and varying stoichiometric proportions of copper and tin and/or indium and/or gallium.

The above-identified materials for the connector and the active area on the microchip are each configured to be combined with the reactive solders defined above to provide solder materials, as set forth in Table 1 below (showing suitable metallurgical forms of solder material).

TABLE 1

| Metal for wire/Chip | Reactive Solder | Eutectic melting Temperature of binary alloy system (° C.) | Intermetallic Phase Melting Temperatures (° C.) |
|---|---|---|---|
| Cu | Sn | 227 | 415; 640 |
|  | In | 153 | 310; 350; 440; 684 (delta) |
|  | Ga | 29.6 | 254; 468; 485; 836; 915 |
| Ag | Sn | 221 | 480; 724 |
|  | In | 144 | 166; 205; 660; 695; |
|  | Ga | 26 | 305; 420; 612 |
| Au | Sn | T1 = 217<br>T2 = 280 | 262; 309; 419; 521; 532 |
|  | In | 156 | 487; 609.6; 640.7 |
|  | Ga | 29 | 339; 415; 461; 491 |

As a point of reference, Cu3Sn has a melting temperature of about 670 degrees Celsius, and Cu6Sn5 has a melting temperature of about 415 degrees Celsius. Beads 126, 128 combine to couple connector 60 to superstrate 106 and electrically couple connector 60 to superstrate 106 and active surface 58 of chip 56.

In one embodiment, power copper superstrate 106 is deposited at a thickness of about 10 microns onto active surface 58 of chip 56, material 108 is deposited at a thickness of about 5 microns onto superstrate 106, and connector 60 is provided at a diameter of about 15 microns and is diffusion soldered onto power copper superstrate 106. Other diameters of connector 60 are also acceptable. During bonding, the tin 108 and the copper (connector 60/superstrate 106) form an alloy of Cu3Sn and Cu6Sn5 bronzes. Bonding temperature is about 270 degrees Celsius with a bond time of about 3 minutes. The bond between connector 60 and power copper superstrate 106 is made with a bond force that is lower than standard wire bonding, and with no ultrasonic energy or vacuum.

Figure 3B:
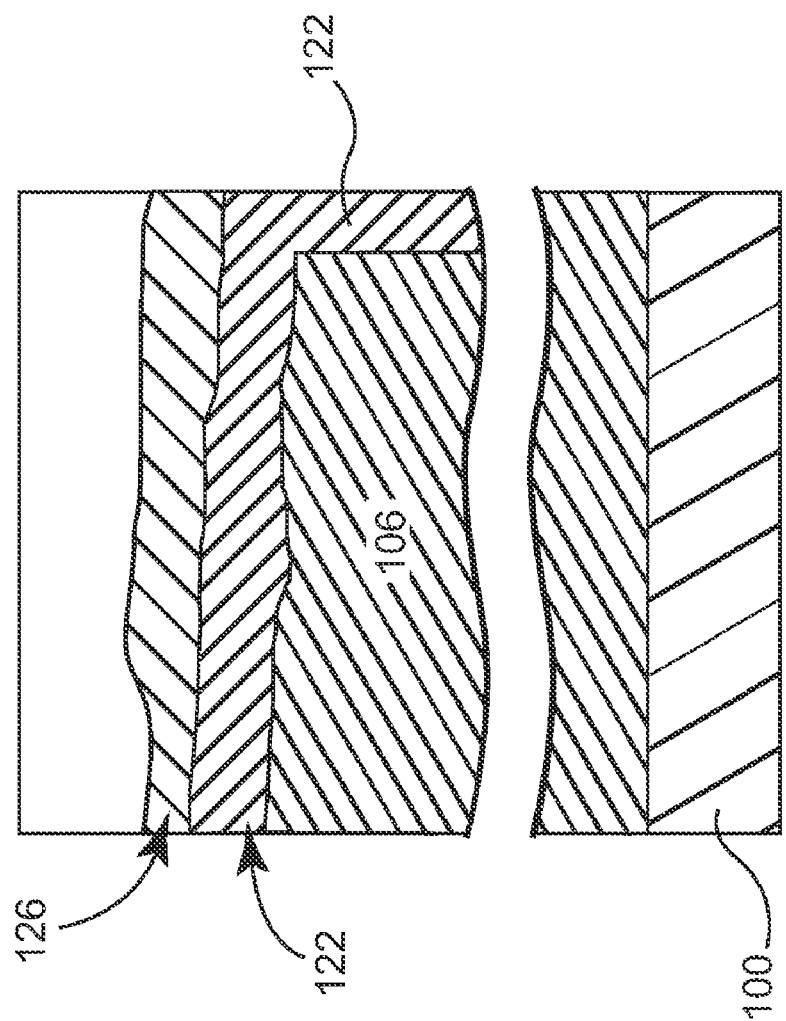
FIG. 3B is a cross-sectional view of solder material employed to attach the connector of FIG. 3A to the contact area.

FIG. 3B is a cross-sectional view of a portion of FIG. 3A with the cross-section taken at the outermost lateral portions of chip 56. Near the periphery of the connection formed by material 108 (FIG. 2) and connector 60, power copper superstrate 106 includes a thin (about 1 micron) conformal bronze coating 122, and a thin (about 1 micron) first bronze bead 126 layer is disposed on conformal coating 122.

Figure 4:
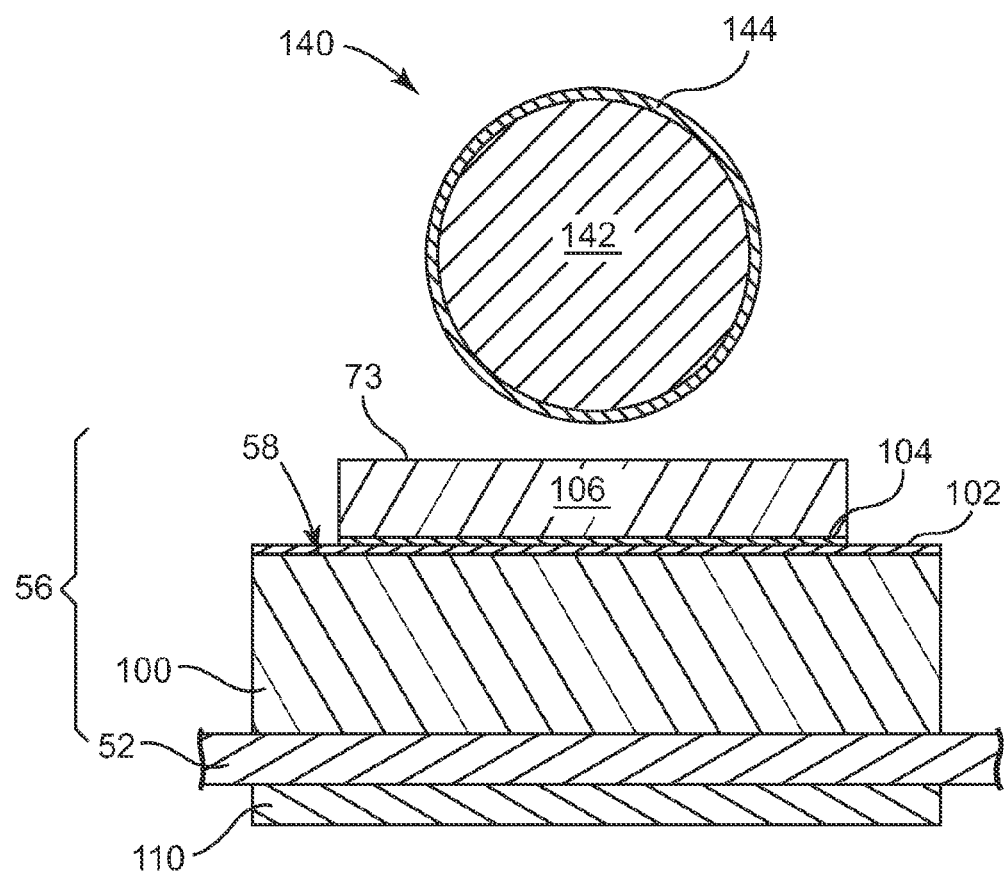
FIG. 4 is a cross-sectional view of a semiconductor device illustrating another connector prior to attachment to a contact area on a chip.

FIG. 4 is a cross-sectional view of chip 56 and another connector 140 configured for attachment to a contact area 73 disposed above active surface 58 of chip 56 according to one embodiment. In this embodiment, tin material is provided on connector 140 and is configured to alloy with copper portions of connector 140 and power copper superstrate 106 when bonded to chip 56.

In one embodiment, connector 140 includes a copper core 142 and tin 144 coated over copper core 142. In one embodiment, heater 110 is provided on a backside of chip 56 and is configured to heat chip 56 to a temperature suited for bonding with connector 140. In particular, heater 110 is configured to heat chip 56 to a temperature suitable for alloying tin 144 with power copper superstrate 106 and copper core 142 when connector 140 contacts chip 56.

Figure 5:
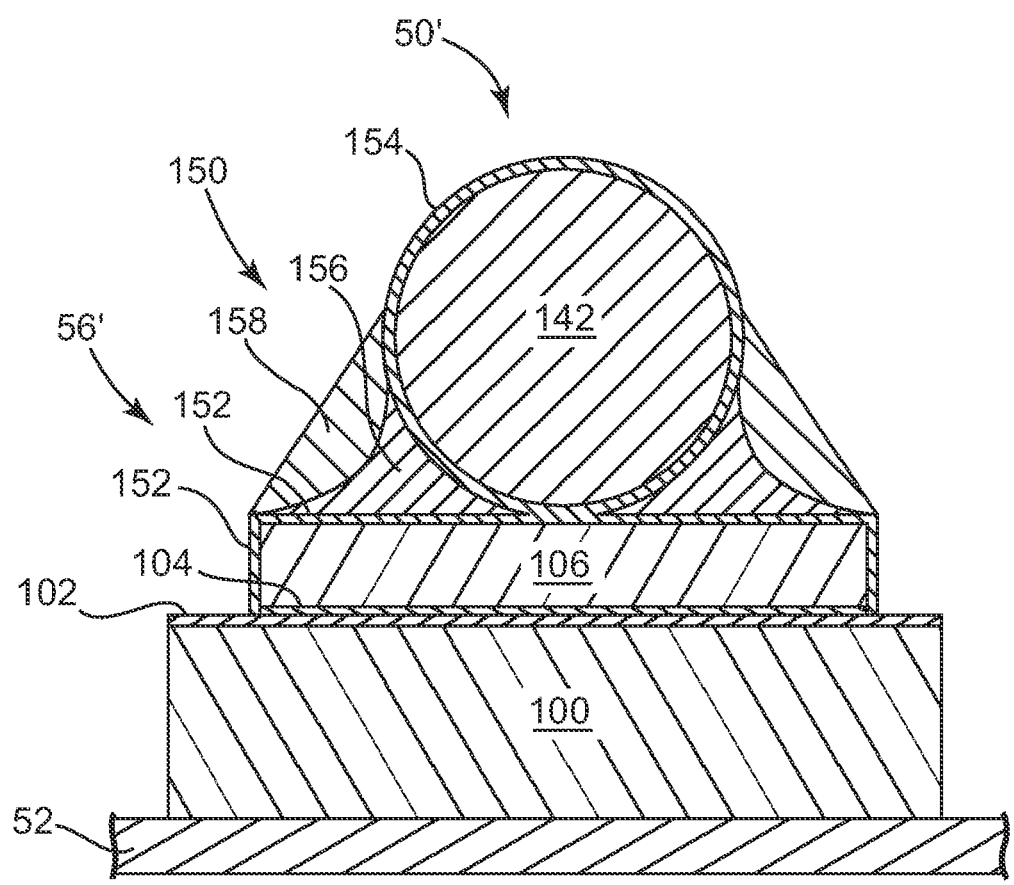
FIG. 5 is a cross-sectional view of the connector attached to the contact area of the chip shown in FIG. 4.

FIG. 5 is a cross-sectional view of copper core 142 bonded to power copper superstrate 106 according to one embodiment. In one embodiment, copper core 142 is diffusion solder bonded at a temperature of about 260 degrees Celsius to power copper superstrate 106 such that tin 144 (FIG. 4) melts and forms an alloy with the copper to define a solder material 150 that couples and electrically connects copper core 142 to power copper superstrate 106. Solder material 150 is similar to solder material 120 (FIG. 3A).

In particular, in one embodiment solder material 150 includes a bronze conformal coating 152 uniformly disposed over power copper superstrate 106, a bronze sheath 154 wetted around copper core 142, a first bronze bead 156 extending between conformal coating 152 and sheath 154, and a second bead 158 contacting first bronze bead 156. In one embodiment, tin material 144 forms an alloy with the copper in a manner similar to that described above for material 108 (FIG. 2), wetting the copper of connector 140 and chip 56.

In one embodiment, conformal coating 152 is similar to conformal coating 122 (FIG. 3A) and includes a Cu3Sn bronze, and sheath 154 is similar to sheath 124 and includes a Cu3Sn bronze. In one embodiment, first bead 156 is similar to first bead 126 and includes a Cu6Sn5 bronze. In one embodiment, second bead 158 is similar to second bead 128 and includes a bead of pure tin in contact with the first bead 156. Other suitable metallurgical forms of solder material 250 are also acceptable, including varying stoichiometric proportions of copper and tin.

Figure 6:
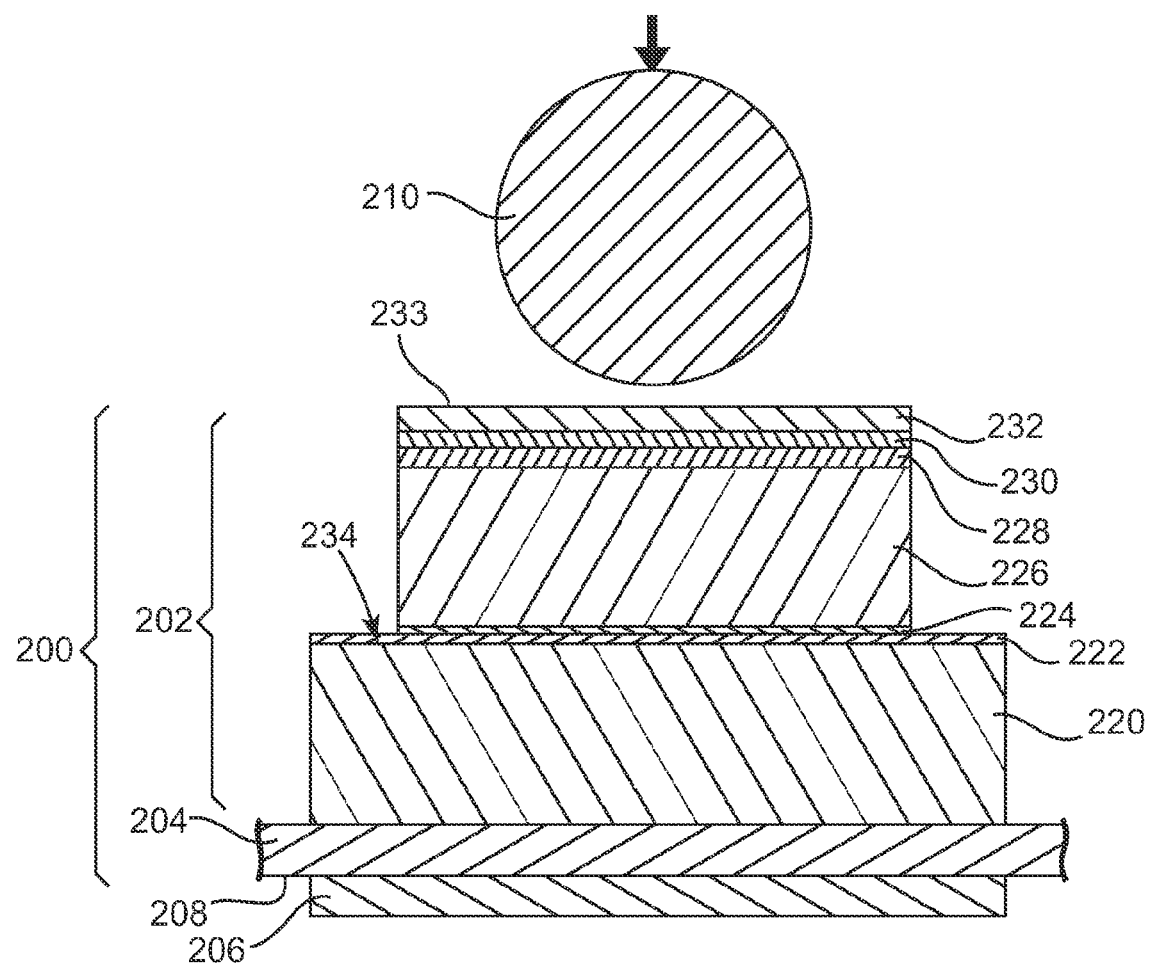
FIG. 6 is a cross-sectional view of another semiconductor device illustrating attachment of a connector between a carrier and a chip attached to the carrier according to one embodiment.

FIG. 6 is a cross-sectional view of another semiconductor device 200 illustrating attachment of a connector 210 to a chip 202 according to one embodiment. Die package 200 includes chip 202 mounted on a carrier 204. In one embodiment, a heater 206 is applied to a backside 208 of die package 200 to facilitate electrical connection with connector 210. One embodiment of die package 200 provides a tin layer 232 that is configured to enable low temperature diffusion soldering of connector 210 to die 202.

In some embodiments, the conventional and readily available standard wire assembly tooling is employed to feed and attach connector 210 to chip 202, where the standard tooling is operated at a relatively high temperature, bond force, and include the use of ultrasonic energy. With this in mind, chip 202 is provided with a hard coat 228 that configures die package 200 to withstand the high bond forces of the conventional wire assembly tooling.

In one embodiment, chip 202 includes a substrate 220 mounted to carrier 204, a passivation layer 222 deposited on substrate 220, a metal layer 224 deposited on passivation layer 222, a power copper superstrate 226 deposited on substrate 220 above metal layer 224, a hard coat 228 deposited on a top surface of power copper superstrate 226, and adhesion layer 230 deposited on hard coat 228 that is configured to adhere tin material 232 on top of chip 202. Tin material 232 defines a contact area 233 to which connector 210 is bonded/attached.

In one embodiment, multiple chips 202 are fabricated on a wafer and include an in situ deposition of power copper 226, hard coat 228, adhesion layer 230, and tin 232 that are suitably pattern-resist plated, and wet-etch cleaned to remove resist and other layers. The wafer is subsequently singulated into a plurality of chips 202.

In one embodiment, substrate 220 is a silicon substrate, passivation layer 222 is a glass passivation layer such as silicon nitride having suitable path openings for electrical contact with power copper superstrate 226, and metal layer 224 is a titanium-tungsten metal layer. In one embodiment, hard coat 228 includes nickel, alloys of nickel such as nickel palladium (NiPd), tin, or alloys of tin. In one embodiment, adhesion layer 230 is a copper adhesion layer configured to bond tin material 232 to nickel hard coat 228. Other adhesion layers, including alloys of copper, are also acceptable.

In one embodiment, connector 210 is a copper wire connector 210 indexed into position for bonding by conventional wire bond assembly tooling that is associated with employing high levels of force when attaching a connector. Even though high-force standard wire bond tooling is employed in this particular embodiment, tin material 232 and hard coat 228 are configured to enable the copper wire connector 210 (having superior electrical properties over gold or aluminum connectors) to be connected to chip 202 without damaging an active surface 234 of chip 202. In a manner similar to that described above for FIG. 3A, tin material 232 forms an alloy with copper connector 210 to form a bronze solder connection interface similar to solder material 120 and 150, and more fully described below.

Figure 7:
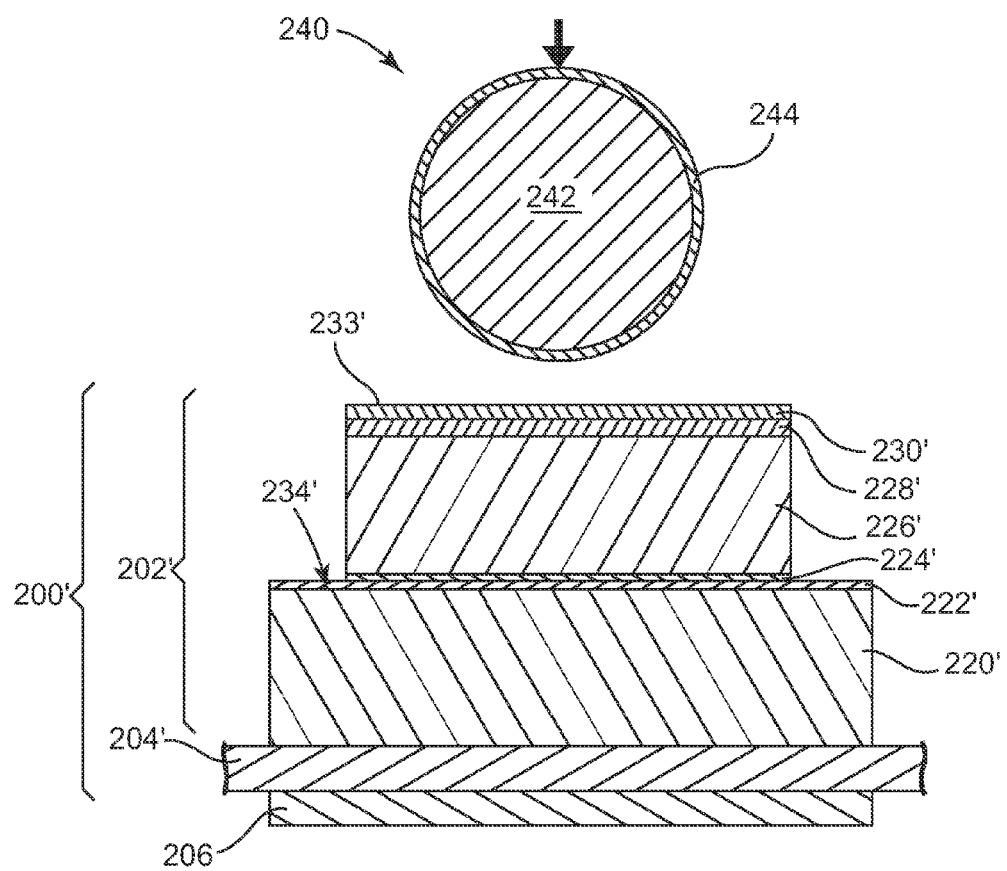
FIG. 7 is a cross-sectional view of another semiconductor device illustrating another connector prior to attachment to a contact area on a chip according to one embodiment.
Figure 9:
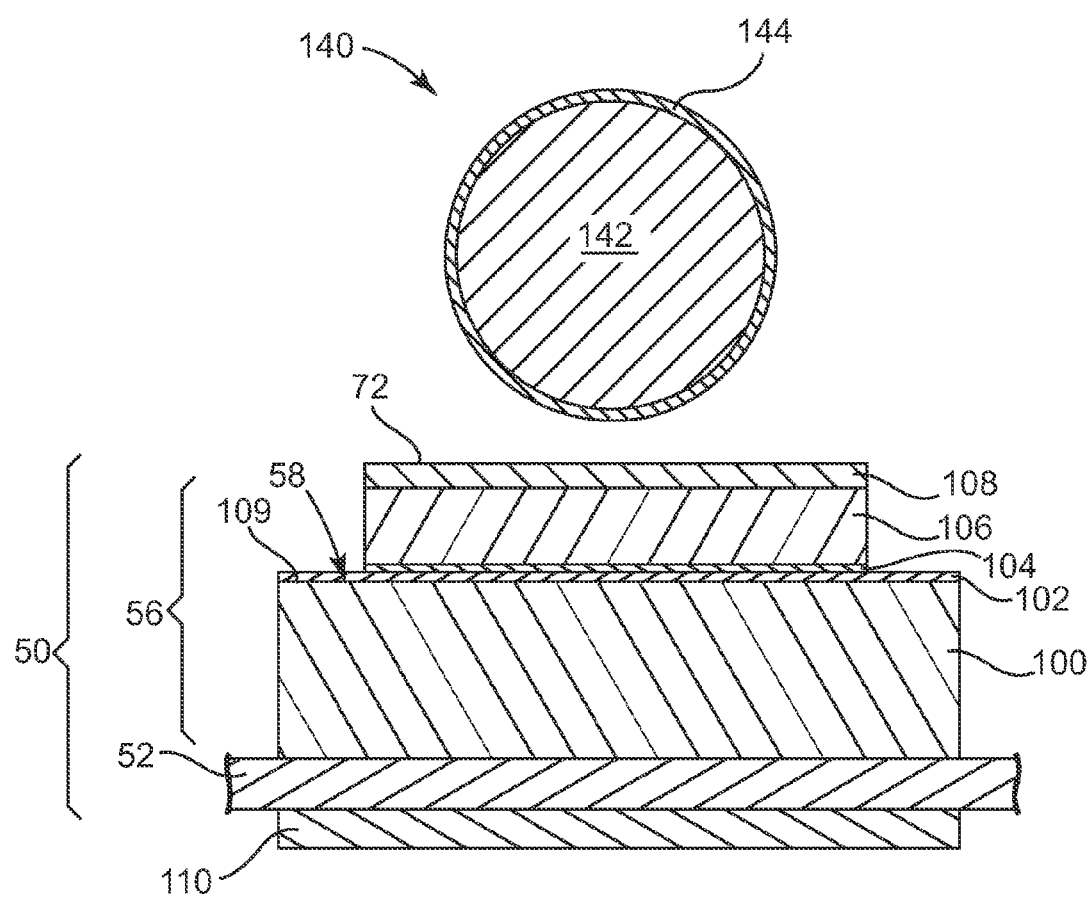
FIG. 9 is a cross-sectional view of a microchip chip and a connector configured for attachment to contact area of chip, where each of the chip and the connector include a tin solder layer according to one embodiment.

FIG. 7 is a cross-sectional view of another semiconductor device 200' illustrating another connector 240 prior to attachment to a chip 202' according to one embodiment. Die package 200' includes a hard coat 228' configured to accommodate high bond forces during electrical connection of connectors to contact area 233' above active area 234' of die 202'. Connector 240 includes tin 244 that is configured to bond connector 240 to chip 202'. Tin material may be included on the chip (such as tin material 232 in FIG. 6), or tin material may be included on connector (such as connector 240). Alternatively, tin material is included on the chip (e.g., tin material 232 in FIG. 6) and tin material is included on connector (e.g., tin material 244 on connector 240) substantially as shown in FIG. 9.

In one embodiment, connector 240 includes a copper core 242 and a tin sheath 244 deposited around copper core 242. Heater 206 heats chip 202' to a temperature of about 260 degrees Celsius to melt the tin sheath 244 and alloy the tin 244 with the power copper superstrate 226', the copper adhesion layer 230', and the copper core 242. In this regard, tin sheath 244 disposed on copper core 242 provides the same methodology of tin-copper alloy bronzes that form the electrical connection between connector 240 and chip 202' (where the bond is similar to that described above in FIG. 5).

Figure 8:
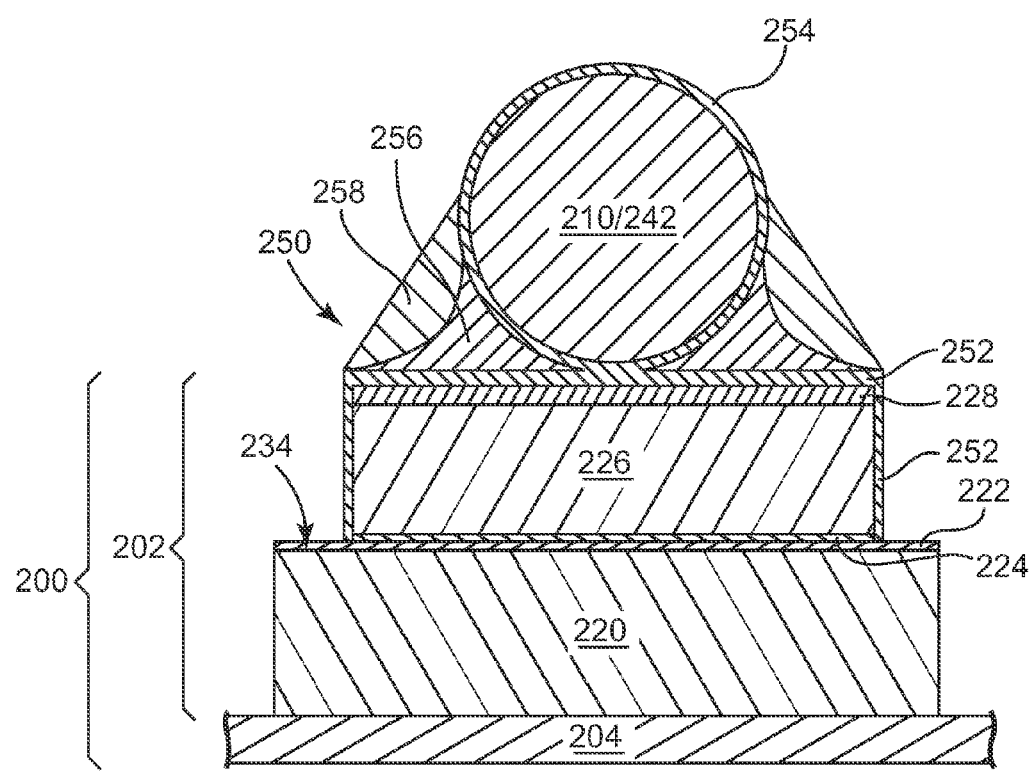
FIG. 8 is a cross-sectional view of solder material employed to electrically couple a connector to a contact area of a chip according to one embodiment.

FIG. 8 is a cross-sectional view of connector 210/242 electrically coupled to die 202 to define a semiconductor device die package 200. In one embodiment, solder bonding of connector 210/242 to active surface 234 of die 202 provides solder material 250 that includes a bronze alloy formed onto the copper portions of connector 210/242 and power copper superstrate 226.

In particular, in one embodiment solder material 250 includes a bronze conformal coating 252 on lateral sides of power copper superstrate 226 and over hard coat 228, a bronze conformal sheath 254 coated on connector 210/242, a first bronze bead 256 coupled between connector 210/242 and active surface 234, and a tin bead 258 disposed onto first bead 256. Similar to the connections described above, in one embodiment conformal coating 252 and sheath 254 are a bronze of $Cu_3Sn$, first bead 256 is a bronze of $Cu_6Sn_5$, and second bead 258 is pure tin. Other suitable metallurgical forms of solder material 250 are also acceptable, including varying stoichiometric proportions of copper and tin.

FIG. 9 is a cross-sectional view of microchip 56 similar to chip 56 of FIG. 2 and a connector 140 similar to connector 140 of FIG. 4, where connector 140 is configured for attachment to contact area 72 of chip 56 according to one embodiment. In this embodiment, tin material is provided on chip 56 as layer 108 and tin material is provided connector 140 as layer 144. The tin 108, 144 is configured to alloy with copper portions of connector 140 and power copper superstrate 106 when bonded to chip 56, in a manner similar to the connections described above.

Embodiments provide a semiconductor microchip having an active surface, where the microchip is attached to a carrier such that the active surface is oriented to face away from the carrier. A tin material is provided that enables a copper connector of a die package to couple to the active surface of the microchip under low temperature and low force. In particular, the tin material is configured to alloy with copper portions of the connector and the semiconductor microchip to form solder material configured to electrically couple between the active surface of the chip and the carrier to which the chip is attached. The tin material enables connection of the copper connector at temperatures under about 300 degrees Celsius and at low assembly forces without the use of ultrasonic energy. In this regard, the sensitive active surface of the semiconductor microchip is protected against damage during wire bonding of the chip into a die package. In addition, the solder material includes a bronze portion that conformally coats the copper materials to minimize the possibility of undesirable oxidation of the copper connector and the copper pad. Some embodiments include a hard coat provided on chip that enables electrical connection by the tin formation metallurgy described above even when high-force connector tooling is employed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of a semiconductor device having a copper connector coupled to a contact area of a microchip. Therefore, it is intended that this invention be limited only by the claims and the equivalents thereof.

What is claimed is:

1. A method of electrically interconnecting a semiconductor chip to another electronic device, the method comprising:
providing a carrier including contact pins and a chip attached to the carrier, the chip having a copper contact pad that faces away from the carrier;

extending a copper electrical connector between the contact pins and the contact pad; and diffusion soldering the copper electrical connector to the contact pad with a solder material including tin to form a solder connection including a contiguous bronze coating disposed between and in direct contact with both the copper electrical connector and the contact pad.

2. The method of claim 1, wherein the copper electrical connector comprises one of a copper bondwire, a copper ribbon, and a copper clip, and extending the copper electrical connector comprises extending a copper electrical connector from a ballbond machine to a position between the contact pins and the contact pad.

3. The method of claim 1, wherein diffusion soldering the copper electrical connector to the contact pad comprises:
coating at least one of the copper electrical connector and contact pad with the solder material including tin;
heating the solder material to wet the solder material to the copper electrical connector and the contact pad, wherein the bronze coating is formed by a reaction between the tin of the solder material and the copper of the copper electrical connector and of the contact pad.

4. The method of claim 3, wherein diffusion soldering comprises diffusion soldering at a temperature of approximately 260 degrees Celsius.

5. The method of claim 3, wherein coating the contact pad includes pattern-resist plating a power copper substrate including the contact pad with the solder material including tin.

6. The method of claim 1, wherein diffusion soldering the copper electrical connector to the contact pad with tin comprises:
forming a first bead of bronze on the contiguous bronze coating between the copper electrical connector and the contact pad; and
forming a second bead of substantially pure tin over the first bead of bronze and between the copper electrical connector and the contact pad.

7. The method of claim 6, wherein the contiguous bronze coating comprises Cu3Sn bronze and the first bead comprises Cu6Sn5 bronze.

8. The method of claim 3, including coating only the copper electrical connector with the solder material including tin.

9. The method of claim 3, including coating only the contact pad with the solder material including tin.

10. The method of claim 3, including coating both the copper electrical connector and the contact pad with the solder material including tin.

11. The method of claim 3, wherein the contact pad is on an active side of the chip and heating comprises applying a heater to a backside of the chip opposite the active side.

12. The method of claim 1, wherein the diffusion soldering includes pressing the copper electrical connector against the contact pad without the use of ultrasonic energy.

13. A method of connecting a copper electrical connector to a copper contact pad of a chip, the method including:
diffusion soldering the copper electrical connector to the copper contact pad using a solder material including tin to form a contiguous bronze coating disposed between and in direct contact with both the copper electrical connector and the contact pad,
wherein the contiguous bronze coating completely surrounds the copper electrical connector.

14. The method of claim 13, wherein diffusion soldering includes heating the solder material to approximate 260 degrees Celsius, and pressing the copper electrical connector to the copper contact pad in the absence of ultrasonic energy.

15. The method of claim 13, wherein diffusion soldering includes pressing the copper electrical connector to the copper contact pad in the absence of ultrasonic energy.

16. A method of connecting a copper electrical connector to a copper contact pad of a chip, the method including:
diffusion soldering the copper electrical connector to the copper contact pad using a solder material including tin to form a contiguous bronze coating disposed between and in direct contact with both the copper electrical connector and the contact pad,
wherein diffusion soldering includes forming a first bead of bronze disposed on the contiguous bronze coating, and forming a second bead of bronze comprising substantially pure tin disposed over the first bead of bronze.

17. The method of claim 13, including coating the copper electrical connector with the solder material prior to the diffusion soldering.

18. The method of claim 13, including coating the copper contact pad with the solder material prior to the diffusion soldering.

19. The method of claim 13, including coating the copper contact pad and the copper electrical connector with the solder material prior to the diffusion soldering.

20. A method of connecting a copper electrical connector to a copper contact pad of a chip, the method including:
applying a coating of a tin material over at least one of the copper electrical connector and the copper contact pad;
heating the tin material to cause the tin material to react with the copper of the electrical connector and of the contact pad to form a solder connection comprising a contiguous bronze coating disposed between and in direct contact with the copper electrical connector and the copper contact pad, a first bead of bronze disposed on the contiguous bronze coating, and forming a second bead of bronze comprising substantially pure tin disposed over the first bead of bronze.

\* \* \* \* \*